United States Patent [19]
Nishi et al.

[11] Patent Number: 5,949,140
[45] Date of Patent: *Sep. 7, 1999

[54] MICROWAVE SEMICONDUCTOR DEVICE WITH VIA HOLES AND ASSOCIATED STRUCTURE

[75] Inventors: Seiji Nishi; Tomoji Hamada, both of Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/857,255

[22] Filed: May 16, 1997

[30] Foreign Application Priority Data

May 30, 1996 [JP] Japan ................................. 8-137243

[51] Int. Cl.$^6$ .................................................. H01L 23/34
[52] U.S. Cl. ........................... 257/728; 257/698; 257/276
[58] Field of Search ................................. 257/678, 690, 257/698, 728, 734, 275, 276

[56] References Cited

U.S. PATENT DOCUMENTS

| | | | |
|---|---|---|---|
| 3,670,218 | 6/1972 | August et al. ............................ | 257/507 |
| 4,516,149 | 5/1985 | Wakui et al. ............................. | 357/71 |
| 5,070,390 | 12/1991 | Shimizu ................................... | 257/668 |
| 5,202,752 | 4/1993 | Honjo ...................................... | 257/678 |
| 5,352,998 | 10/1994 | Tanino ..................................... | 333/247 |
| 5,378,926 | 1/1995 | Chi et al. ................................. | 257/767 |
| 5,446,316 | 8/1995 | Temple et al. ........................... | 257/704 |
| 5,477,088 | 12/1995 | Rockett et al. .......................... | 257/764 |
| 5,614,743 | 3/1997 | Mochizuki ............................... | 257/276 |
| 5,635,762 | 6/1997 | Gammand ................................ | 257/728 |
| 5,689,138 | 11/1997 | Dekker et al. ........................... | 257/728 |

FOREIGN PATENT DOCUMENTS

| | | | |
|---|---|---|---|
| 59-172748 | 9/1984 | Japan ...................................... | 257/276 |
| 405114683 | 5/1993 | Japan ...................................... | 257/698 |

OTHER PUBLICATIONS

*MMIC Design GaAs FETs and HEMTs*, Chapter 3: "Overview of Passive Elements", Peter H. Ladbrooke, 1989, p. 29 (Artech House).

"A New Millimeter–Wave Flip–Chip IC on Si Subtrate", *1994 Asia–Pacific Microwave Conference Proceedings*, Sakai et al., 1994, pp. 291–294.

*Primary Examiner*—Valencia Martin-Wallace
*Assistant Examiner*—George C. Eckert, II
*Attorney, Agent, or Firm*—Jones Volentine, L.L.P.

[57] ABSTRACT

A semiconductor device for a microwave circuit includes a semiconductor substrate with an active element formed in the top surface, surface wirings on the top surface of the semiconductor substrate which are connected to terminals of the active element, and rear electrodes on the rear surface of the semiconductor substrate which are connected to the surface wirings by via holes. A structure includes the microwave semiconductor device, and a dielectric substrate which has surface wirings on a top surface. The semiconductor device is fixed with the dielectric substrate such that the rear electrodes of the semiconductor device are connected with the wirings on the top surface of the dielectric substrate.

6 Claims, 7 Drawing Sheets

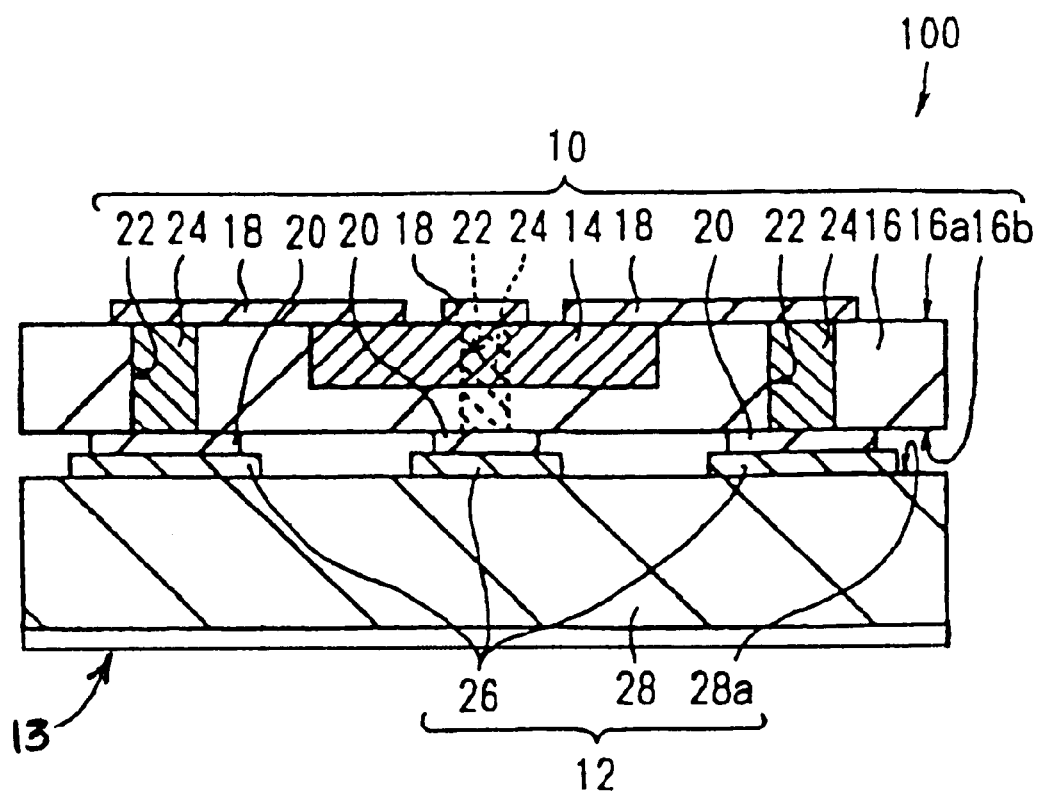
F I G. 1

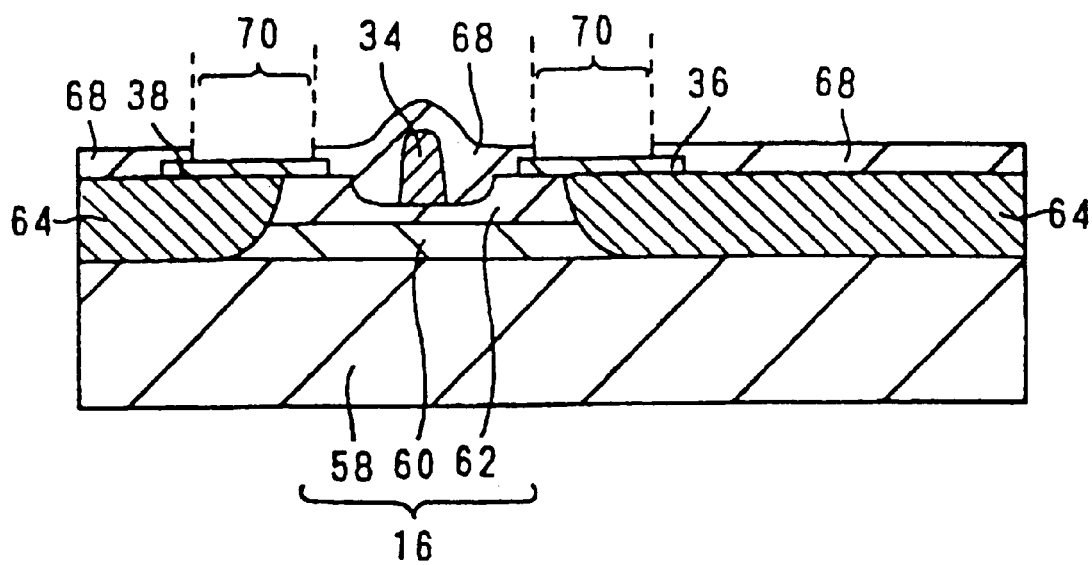
F I G. 5 (A)
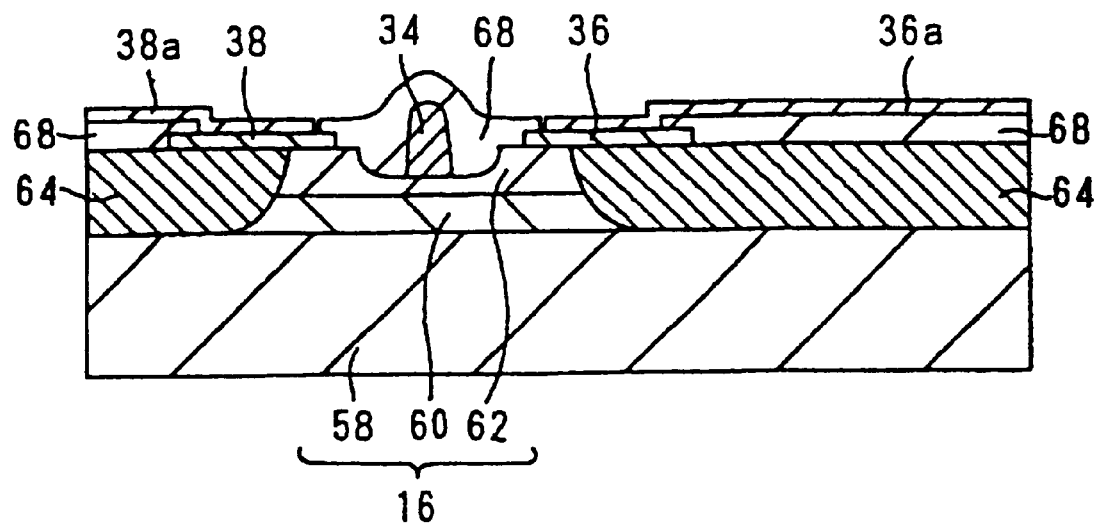
F I G. 5 (B)

F I G. 7
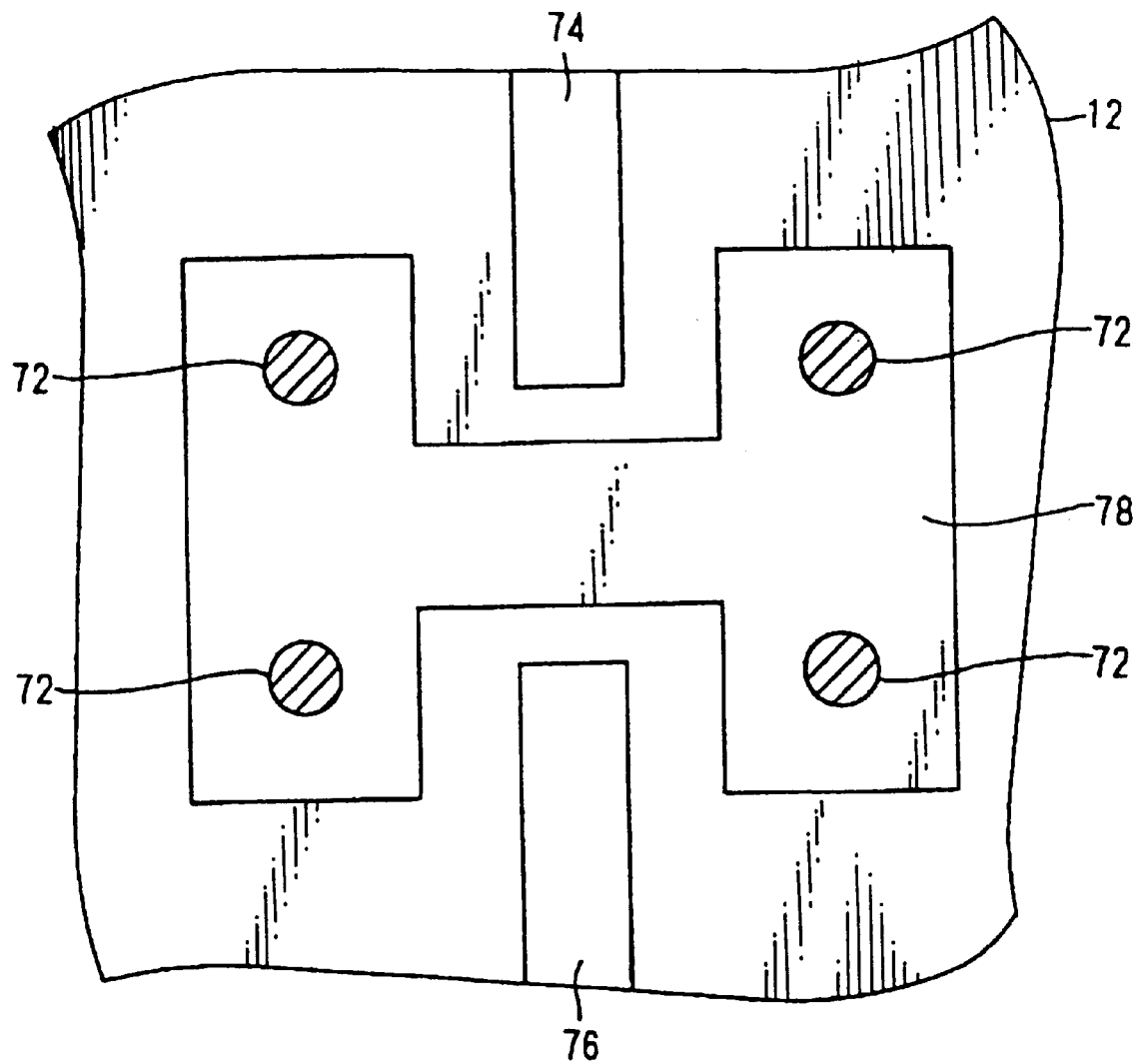

MICROWAVE SEMICONDUCTOR DEVICE WITH VIA HOLES AND ASSOCIATED STRUCTURE

TECHNICAL FIELD

This invention relates to a semiconductor device and a structure including a semiconductor device, more particularly to a semiconductor device and a structure including a semiconductor device employable for a microwave circuit. More specifically, this invention relates to a semiconductor device representing a microwave circuit composed of field effect transistors, high electron mobility transistors (HEMTs), diodes, bipolar transistors, resistors, capacitors and/or the like, produced in a semiconductor substrate e.g. a GaAs substrate, and a structure including a semiconductor device defined as a structure in which the foregoing semiconductor device is arranged on a dielectric substrate.

BACKGROUND OF THE INVENTION AND PRIOR ART STATEMENT

A monolithic microwave circuit is available in the prior art. The monolithic microwave circuit composed of a plurality of active and passive elements connected to each other, is produced in the surface region of a semiconductor substrate e.g. a GaAs substrate. Since GaAs has a large amount of electron mobility and hole mobility, GaAs transistors have a large amount of switching speed, resultantly employable for a microwave circuit. The foregoing monolithic microwave circuit is usually arranged on a dielectric substrate, resultantly constituting a structure including a semiconductor device. The terminals of the monolithic microwave circuit are bonded to the terminal pads of wirings laid on the dielectric substrate, usually by employing gold wires. The monolithic microwave circuit arranged on a dielectric substrate which monolithic microwave circuit is defined as a structure including a semiconductor device in this specification, is confined in a package, resultantly causing a drawback in which the inductance component of the gold wire notably increases.

It is known in the prior art that the foregoing drawback can be removed by employing the idea of monolithic microwave integrated circuit (MMIC) (See FIG. 3.1 on page 29 of "MMIC Design GaAs FETs and HEMTs", Peter H. Ladbrooke, Artech House, 1988).

In addition, it is known in the prior art that the foregoing drawback can be removed by employing the flip chip system ("Proceeding of 1994 Asia Pacific Microwave Conference, P.291–294).

However, the MMIC is involved with the other drawback in which the production cost is increased, because it requires an expensive GaAs substrate.

Although the flip chip system allows to use a less expensive dielectric substrate, the flip chip system is involved with another drawback in which the strength of adhesion between a semiconductor device and a dielectric substrate is not large. As a result, a light setting resin adhesive is required to adhere the semiconductor device to the dielectric substrate (See FIG. 1 of "Proceeding of 1994 Asia Pacific Microwave Conference, P.291–294). This causes a drawback in which an air bridge, if any, is covered by a hardened resin adhesive, resulting in a large amount of electrostatic capacity in the portion covered by the hardened resin adhesive. Incidentally, the area by which the semiconductor device is adhered to the dielectric substrate is less, resulting in an insufficient capacity to disperse heat.

OBJECTS AND SUMMARY OF THE INVENTION

Accordingly, a first object of this invention is to provide a semiconductor device which is appropriate for a microwave circuit.

A second object of this invention is to provide a structure including a semiconductor device in which the area by which a semiconductor device is adhered to a dielectric substrate is sufficiently large and the strength of adhesion between a semiconductor device and a dielectric substrate is sufficiently large.

To achieve the first object of this invention, a semiconductor device in accordance with the first embodiment of this invention comprises: a semiconductor substrate further comprising:

at least one active element having a plurality of terminals produced in the upper region of the semiconductor substrate, a plurality of wires respectively connected with the plurality of terminals of the active element, the wires being arranged on the top surface of the semiconductor substrate, a plurality of rear electrodes arranged on the rear surface of the semiconductor substrate, and a plurality of via hole wirings for connecting the wires and the rear electrodes, the via hole wirings being arranged in a via hole penetrating the semiconductor substrate.

A GaAs substrate is appropriate for this embodiment.

The active elements employed in this embodiment can be a field effect transistor, a HEMT, a diode or a bipolar transistor.

To achieve the second object of this invention, a structure including a semiconductor device in accordance with the second embodiment of this invention comprises:

a semiconductor device comprising:

a semiconductor substrate further comprising:

at least one active element having a plurality of terminals produced in the upper region of the semiconductor substrate, a plurality of wires respectively connected with the plurality of terminals of the active element, the wires being arranged on the top surface of the semiconductor substrate, a plurality of rear electrodes arranged on the rear surface of the semiconductor substrate, and a plurality of via hole wirings for connecting the wires and the rear electrodes, the via hole wirings being arranged in a via hole penetrating the semiconductor substrate, and a dielectric substrate comprising:

a plurality of wirings produced on the top surface of the dielectric substrate, the wirings being connected with the rear electrodes of the semiconductor device.

A GaAs substrate is appropriate for this embodiment.

The active elements employed in this embodiment can be a field effect transistor, a HEMT, a diode or a bipolar transistor.

The output terminals of the wirings produced on the dielectric substrate are allowed to be connected with microstrip lines, lateral microwave waveguides or ground lines.

In this invention, the rear electrodes produced on the rear surface of a semiconductor device are directly connected to the wirings produced on the dielectric substrate, without employing a lead wire, a metal layer produced on the dielectric substrate, or the like. Therefore, the rear electrodes produced on the rear surface of a semiconductor device and the wirings of the dielectric substrate are connected to each other to a satisfactory extent both from the electrical and mechanical viewpoints.

The area by which the conductive parts produced on the semiconductor device are connected to the conductive parts produced on the dielectric substrate is large for this embodiment in comparison with the corresponding area in the case of the flip chip system in which a bump produced on the top surface of a semiconductor substrate is connected in face down with the wirings produced on a dielectric substrate. As a result, the strength of adhesion between the conductive parts produced on the semiconductor device and the conductive parts produced on the dielectric substrate is larger in this embodiment than in the prior art. Since the wiring produced on the top surface of the semiconductor device is connected with the wiring produced on the dielectric substrate through a via hole wiring whose length is identical to the thickness of the semiconductor substrate, the connection length of the conductive parts produced on the semiconductor device and the conductive parts produced on the dielectric substrate is remarkably short.

Since the strength of adhesion between the conductive parts produced on the semiconductor device and the conductive parts produced on the dielectric substrate is large, a light setting resin adhesive is not required to adhere the semiconductor substrate to the dielectric substrate, removing the drawback in which the electromagnetic capacity increases in the neighborhood of an air bridge. Incidentally, since the area by which the conductive parts produced on the semiconductor device are connected to the conductive parts produced on the dielectric substrate is large, the heat generated in the semiconductor device is readily dispersed to the dielectric substrate. In addition, since the connection length of the conductive parts produced on the semiconductor device and the conductive parts produced on the dielectric substrate is short, the amount of the stray capacity caused by the inductance of the connection length is small.

BRIEF DESCRIPTION OF THE DRAWINGS

This invention, together with its various features and advantages, can be readily understood from the following more detailed description presented in conjunction with the following drawings, in which:

FIG. 1 is a schematic cross section of a structure including a semiconductor device in accordance with one embodiment of this invention, FIG. 5(A) is a schematic cross section of a field effect transistor constituting a semiconductor device in accordance with one embodiment of this invention, under production, the cross section being seen in the I—I direction shown in FIG. 2(A), FIG. 5(B) is a schematic cross section of a field effect transistor constituting a semiconductor device in accordance with one embodiment of this invention, under production, the cross section being seen in the I—I direction shown in FIG. 2(A), FIG. 7 is a partial plan view of a dielectric substrate constituting a structure including a semiconductor device in accordance with one embodiment of this invention.

DETAILED DESCRIPTION OF THE PREFERRED EMBODIMENTS OF THIS INVENTION

Figure 2A:
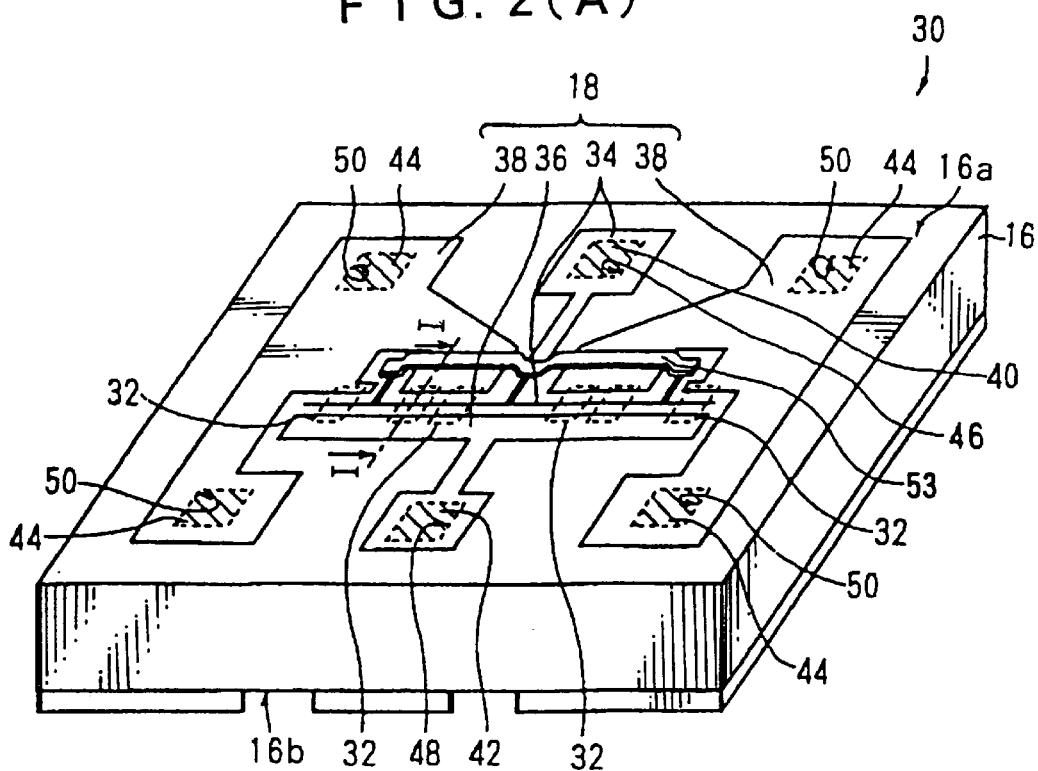
FIG. 2(A) is a perspective view of a semiconductor device in accordance with one embodiment on this invention.

Referring to FIG. 1, a structure including a semiconductor device 100 in accordance with one embodiment of this invention consists of a semiconductor device 10 and a dielectric substrate 12. The semiconductor device 10 has a semiconductor substrate 16 in which an active element 14 is produced and on which three connecting wires 18 each of which is connected with the terminal of the active element 14, are arranged. The top surface of the semiconductor substrate 16 is marked 16a. On the rear surface 16b of the semiconductor substrate 16, three rear electrodes 20 are arranged. The rear electrodes 20 are made of a material which is usually employed for producing a bump. The semiconductor substrate 16 further has three via holes 22 penetrating the semiconductor substrate 16. A via hole wiring 24 is arranged in each of the via holes 22 to connect the connecting wire 18 and the rear electrode 20 produced of a material usually employed for producing a bump, e.g. a piled layer of an Sn layer and an Au layer. One of the three via holes 22 is illustrated in dotted lines, because this is located at a location remote from the page of FIG. 1. Some selections are available for the manner to arrange the via hole wiring 24 in the via hole 22. Namely, the via hole 22 can be lined or buried by a via hole wiring 24 produced of a material usually employed for producing a bump, e.g. a piled layer of an Sn layer and an Au layer.

The dielectric substrate 12 is a ceramic plate produced by calcining an aluminum oxide green sheet, the ceramic plate being backed by a metal layer 13. Three wirings 26 are arranged on the top surface of the dielectric substrate 12.

The rear electrodes 20 are connected to the wirings 26 arranged in the top surface of the dielectric substrate 12.

The active elements 14 which actually is a field effect transistor, a HEMT, a diode or a bipolar transistor is produced in the surface region which downward extends from the top surface 16a of the semiconductor substrate 16 which is a GaAs substrate in this embodiment. The connecting wire 18 arranged on the top surface 16a of the GaAs substrate 16 is connected to the pad of the active element 14. The rear electrode 20 is arranged on the rear surface of the GaAs substrate 16 at a location corresponding to the connecting wire 18 arranged on the top surface 16a of the GaAs substrate 16. At the location corresponding to the connecting wire 18 and the rear electrode 20, a via hole 22 is produced to penetrate the GaAs substrate 16. The via hole wiring 24 is arranged in the via hole 22 to connect the connecting wire 18 and the rear electrode 20.

The semiconductor device 10 is firmly fixed with the dielectric substrate 12 by directly connecting the rear electrode 20 arranged on the rear surface 16b of the semiconductor substrate 16 and the wiring 26 arranged on the dielectric substrate 12. It is noted that the area with which the semiconductor device 10 is connected with the dielectric substrate 12 is much larger than the corresponding area in the case of flip chip system. Therefore, the heat generated in the semiconductor device 10 is readily dispersed into the dielectric substrate 12, resultantly causing stable operation for the active element 14 produced in the semiconductor substrate 16. Further, the foregoing large magnitude of the contact area connecting the semiconductor device 10 and the dielectric substrate 12 causes a firm mechanical connection between the semiconductor device 10 and the dielectric substrate 12. Since the connecting wire 18 and the wiring 26 are connected through the via hole wiring 24 and the rear electrode 20, the connection length is approximately the same as the thickness of the dielectric substrate 12. As a result, the magnitude of the stray inductance is remarkably less.

Referring to FIG. 2(A), six field effect transistors 32 are arranged on the semiconductor substrate 16, specifically the GaAs substrate in this embodiment. The field effect transistors 32 are illustrated by six rectangles shown in dotted lines. A gate electrode 34 shown in a straight rigid line is prepared commonly for the six field effect transistors 32. The common gate electrode 34 is fed by three feeders, of which two are connected by air bridges 53 which are connected to a gate electrode pad 34, which is further connected to a via hole wiring 46 arranged in a via hole 40 penetrating the semiconductor substrate 16 (See FIG. 2(B)). The drain electrode 36 is commonly prepared for the six field effect transistors 32. The drain electrode 36 extends to a drain electrode pad (no mark is given), which is further connected to a via hole wiring 48 arranged in a via hole 42 penetrating the semiconductor substrate 16. Two independent source electrodes 38 are prepared for the six field effect transistors 32. The one which is illustrated in the left side of the drawing is alloted to the three field effect transistors 32 illustrated in the left side of the drawing. The other which is illustrated in the right side of the drawing is alloted to the three field effect transistors 32 illustrated in the right side of the drawing. Each of these source electrodes 38 is connected to a via hole wiring 50 produced in a via hole 44 penetrating the semiconductor substrate 16. The reason why the via holes 40, 42 and 44 are produced at locations remote from the location at which a field effect transistor 32 is produced, is to protect the field effect transistor 32 form potential adverse influences caused by the etching process employed for producing via holes. In FIG. 2(A), the via holes 40, 42 and 44 are shown by hatching. The function of the air bridge 53 is to reduce the amount of electrostatic capacity of crossed lines having a dielectric layer therebetween.

Figure 2B:
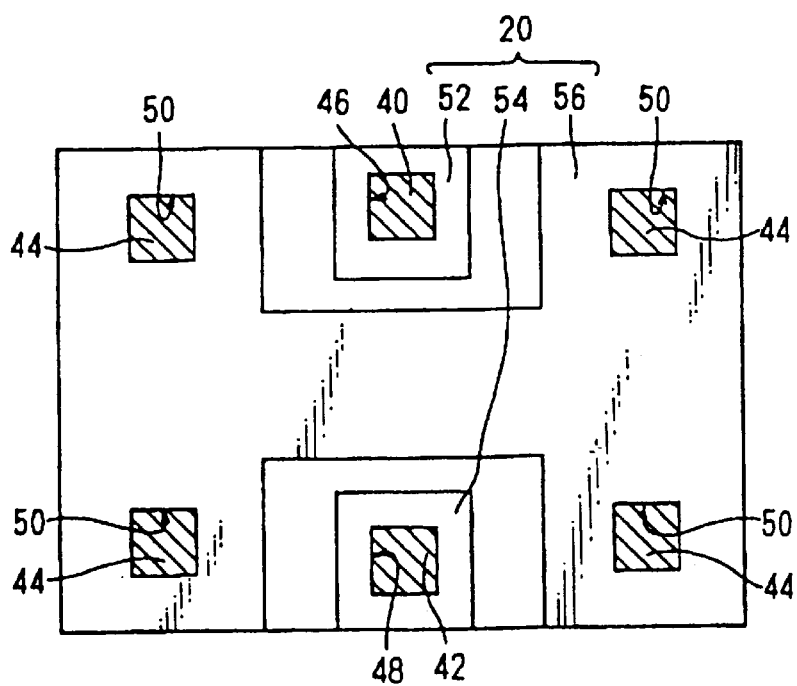
FIG. 2(B) is a bottom plan view of a semiconductor device in accordance with one embodiment on this invention.

Referring to FIG. 2(B), rear electrodes 20 made of a material usually employed for producing a bump, are arranged on the rear surface 16b of the semiconductor substrate 16. The rear electrodes 20 include a rear gate electrode 52 connected to the gate electrode 34, a rear drain electrode 54 connected to the drain electrode 36 and a rear source electrode 56 connected to the source electrode 38. The rear gate electrode 52 connected to the gate electrode 34, the rear drain electrode 54 connected to the drain electrode 36 and the rear source electrode 56 connected to the source electrode 38 are arranged to face, respectively, the gate electrode pad 34, the drain electrode pad and the source electrode pads. Although the drain electrode 36 extends in one plate to reach the via hole wiring 48, the source electrodes 38 are made in two plates placed side by side. The rear gate electrode 52 connected to the gate electrode 34, the rear drain electrode 54 connected to the drain electrode 36 and the rear source electrode 56 connected to the source electrode 38 are connected respectively to the gate electrode pad 34, the drain electrode pad and the source electrode pads respectively through the via hole wiring 46, 48 and 50 respectively arranged in the via hole 40, 42 and 44. In FIG. 2(B), the via holes 40, 42 and 44 are shown by hatching.

Referring to FIG. 3(A) through FIG. 6(B), steps for producing a semiconductor device, specifically a GaAs field effect transistor of this embodiment of this invention, will be described below.

Figure 3A:
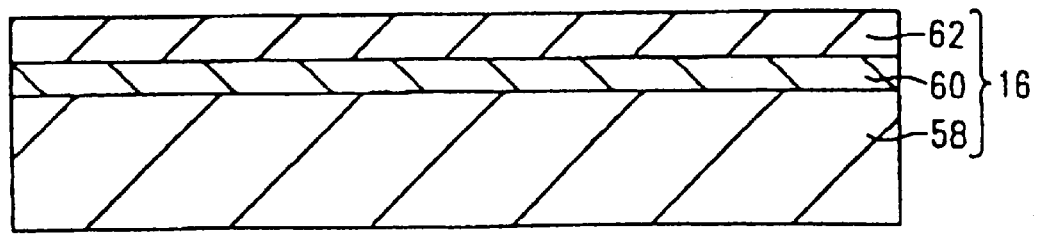
FIG. 3(A) is a schematic cross section of a field effect transistor constituting a semiconductor device in accordance with one embodiment of this invention, under production, the cross section being seen in the I—I direction shown in FIG. 2(A)

Referring to FIG. 3(A), a molecular beam epitaxy process is employed to deposit a non-doped GaAs buffer layer 60 having an approximate thickness of 700 nm and an n-GaAs layer 62 having an approximate thickness of 300 nm in this order on a semi insulating GaAs substrate 58. The pile of the n-GaAs layer 62 produced on the non-doped GaAs buffer layer 60 produced on the semi insulating GaAs substrate 58 is defined as a semiconductor substrate 16 in this specification.

Figure 3B:
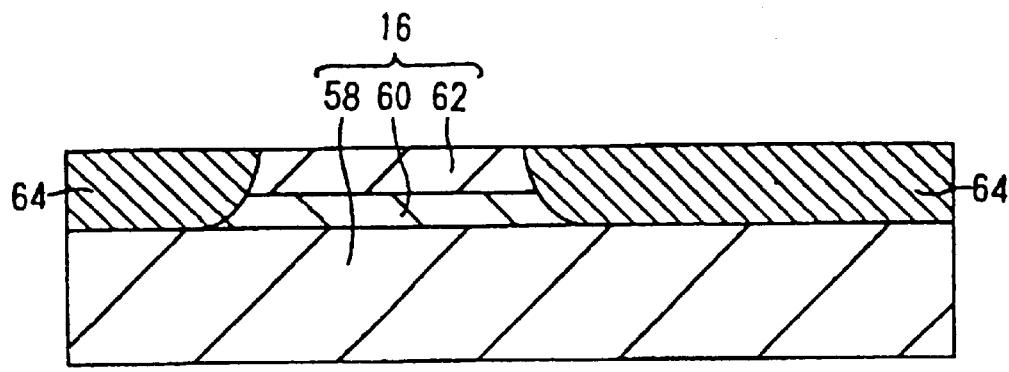
FIG. 3(B) is a schematic cross section of a field effect transistor constituting a semiconductor device in accordance with one embodiment of this invention, under production, the cross section being seen in the I—I direction shown in FIG. 2(A)

Referring to FIG. 3(B), an ion implantation process is employed to implant oxygen ions into the region where a semiconductor element e.g. a field effect transistor, a HEMT, a diode, a bipolar transistor or the like is not produced, for the purpose to produce element separation regions 64.

Figure 3C:
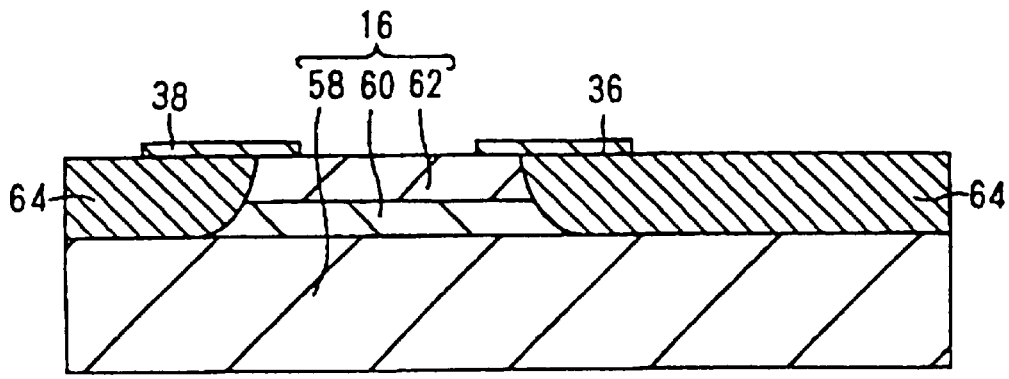
FIG. 3(C) is a schematic cross section of a field effect transistor constituting a semiconductor device in accordance with one embodiment of this invention, under production, the cross section being seen in the I—I direction shown in FIG. 2(A)

Referring to FIG. 3(C), a lift off process is employed to produce piled layers 36 and 38 each of which consists of a Au-Ge alloy layer, a Ni layer and a Au layer piled upward in this order on the area on which a drain electrode and a source electrode are scheduled to be produced. The piled layers 36 and 38 are scheduled to act as a drain electrode and a source electrode.

Figure 4A:
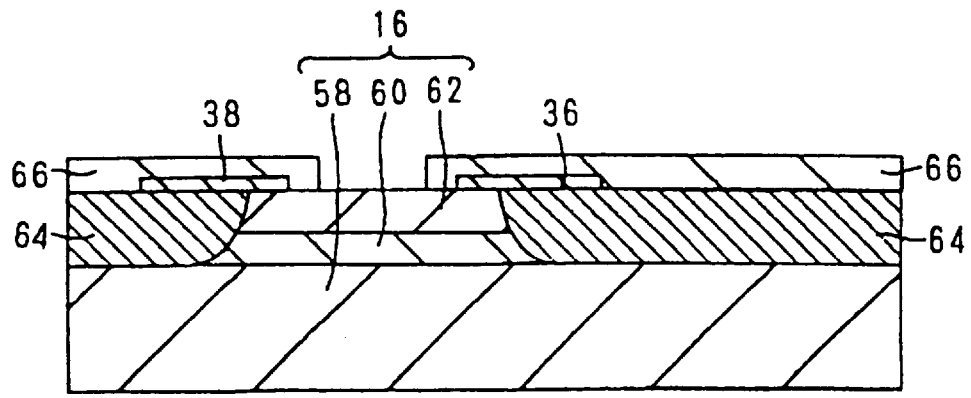
FIG. 4(A) is a schematic cross section of a field effect transistor constituting a semiconductor device in accordance with one embodiment of this invention, under production, the cross section being seen in the I—I direction shown in FIG. 2(A)

Referring to FIG. 4(A), a photoresist layer is produced on the surface of the semiconductor substrate 16, before the photoresist layer is removed from the area at which a recess for a gate electrode is scheduled to be produced, for the purpose to produce an etching mask 66 employable for producing the recess for a gate electrode.

Figure 4B:
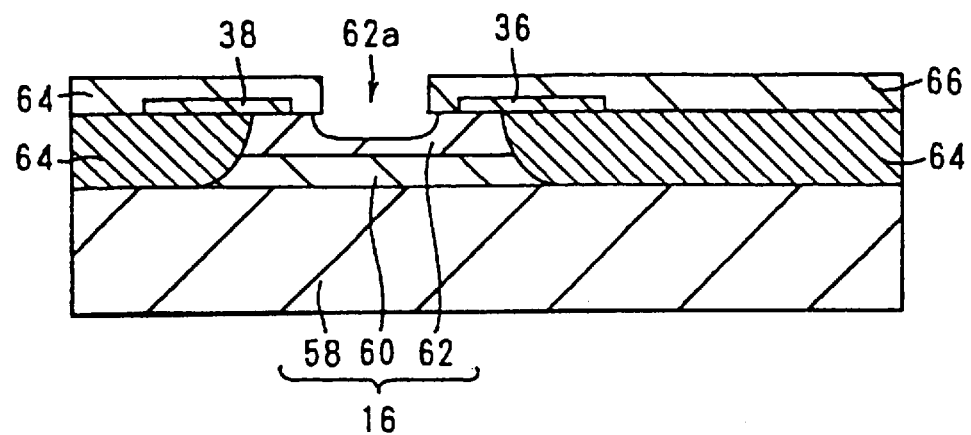
FIG. 4(B) is a schematic cross section of a field effect transistor constituting a semiconductor device in accordance with one embodiment of this invention, under production, the cross section being seen in the I—I direction shown in FIG. 2(A)

Referring to FIG. 4(B), the etching mask 66 is employed to produce a recess 62a for a gate electrode 62a having an approximate depth of 200 nm at the area at which the recess for the gate electrode is scheduled to the produced.

Figure 4C:
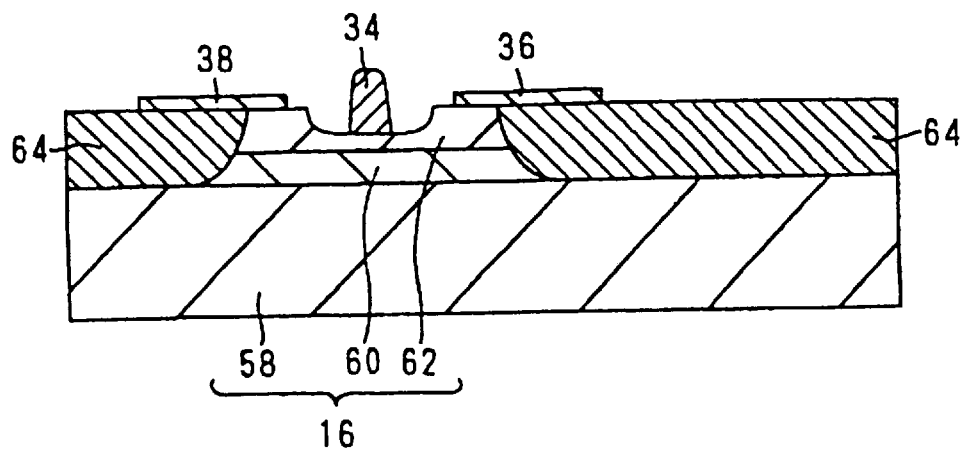
FIG. 4(C) is a schematic cross section of a field effect transistor constituting a semiconductor device in accordance with one embodiment of this invention, under production, the cross section being seen in the I—I direction shown in FIG. 2(A)

Referring to FIG. 4(C), an evaporation lift off process is employed to produce a Schottky gate electrode 34 in the recess 62a. Namely, a photoresist layer (not shown) having an opening at an area at which a gate electrode is scheduled to be produced, is produced. Then, a pile of a Ti layer and an Al layer piled upward in this order is produced, before the photoresist layer (not shown) is removed to remain the pile of a Ti layer and an Al layer piled upward in this order at an area at which a gate electrode is scheduled to be produced.

Referring to FIG. 5(A), a chemical vapor deposition process is employed to produce an SiN layer 68 having an approximate thickness of 500 nm on the entire surface of the semiconductor substrate 16, and the SiN layer 68 is removed from the top of the drain electrode 36 and the source electrode 38. The exposed surface of the drain electrode 36 and the source electrode 38 is defined as a contact surface 70. The SiN layer 68 is removed also from the area on which a gate contact pad is scheduled to be produced (not shown, because the area is remote from the page of the drawing).

Referring to FIG. 5(B), a lift-off process is employed to produce a drain wiring 36a and a source wiring 38a for connecting respectively the drain electrode 36 and the source electrode 38 to the external circuits. The source wiring 38a and the drain wiring 36a are made of a piled layer of Ti/Pt/Au. A gate wiring (not shown) is also produced during the foregoing step for producing the drain wiring 36a and the source wiring 38a.

Thereafter, an air bridge (not shown) is produced, and an SiN passivation layer (not shown) is produced to cover the entire surface of the produced device.

The produced field effect transistor is adhered in face down on a sapphire substrate (not shown) with a wax, and the rear surface of the GaAs substrate 58 is polished to reduce the thickness of the GaAs substrate 58 to approximately 50 $\mu$m. The function of the sapphire substrate (not shown) is to act as a supporter of the semiconductor substrate 16 during the process for producing via holes, the process being conducted in the next step.

Figure 6A:
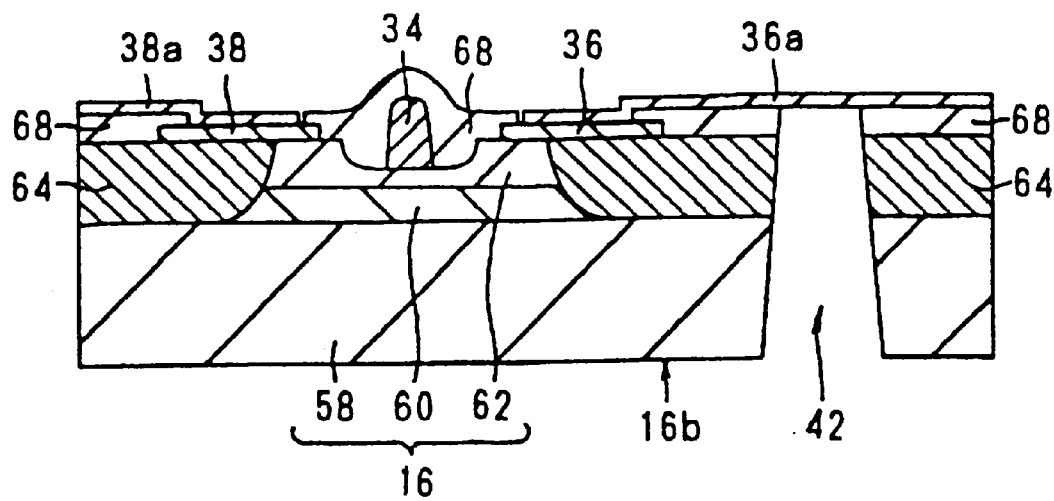
FIG. 6(A) is a schematic cross-section of a semiconductor device in accordance with one embodiment of this invention, under production, the cross section being seen in the I—I direction shown in FIG. 2(A)

Referring to FIG. 6(A), a via hole 42 is produced to penetrate the GaAs substrate 58, the element separation region 64 and the SiN layer 68. The via hole 42 reaches the rear surface of the drain wiring 36a.

Referring to FIGS. (2)A and (2)B, a via hole 40 for the gate connection and four via holes 44 for the source connection are produced in the similar manner. All the via holes are produced simultaneously.

Figure 6B:
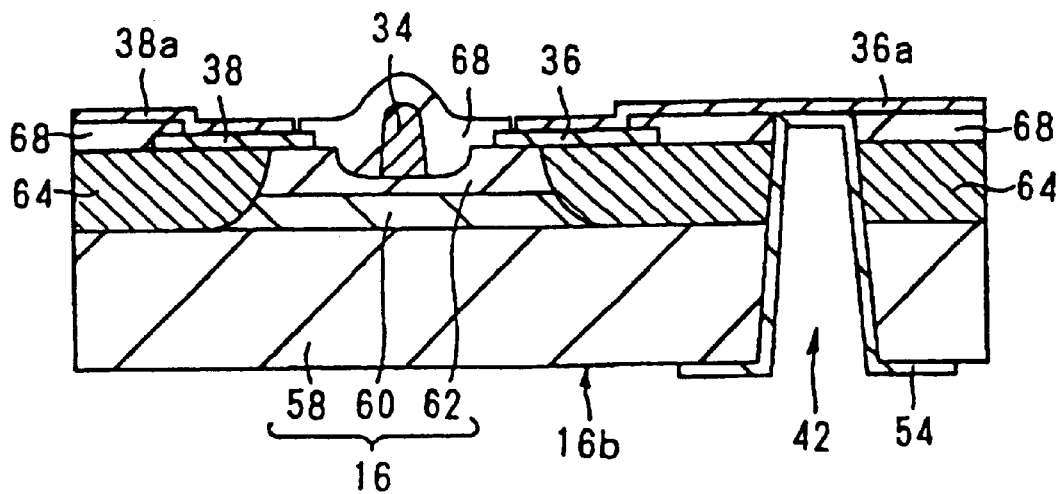
FIG. 6(B) is a schematic cross-section of a semiconductor device in accordance with one embodiment of this invention, under production, the cross section being seen in the I—I direction shown in FIG. 2(A)

Referring to FIG. 6(B), an electrolytic plating process is employed to produce an Au layer of 10 $\mu$m thick and an Sn layer of 200 nm thick on the entire rear surface 16b of the GaAs substrate 58 and on the surface of the via hole 40,42 and 44. The piled layer which lines the via holes 40, 42 and 44 produces a via hole wiring for gate connection 46, a via hole wirings for drain connection 48 and via hole wirings for source connection 50 (See FIG. 2(B)). The piled layer produced on the rear surface 16b of the GaAs substrate 58 produces a gate electrode 52 (See FIG. 2(B)), a drain electrode 54 and a source electrode 56 (See FIG. 2(B)).

Thereafter, the semiconductor substrate 16 is removed from the sapphire substrate (not shown), and the wax is washed away.

The finished GaAs wafer is diced to field effect transistor tips having a dimension of 500 $\mu$m×580 $\mu$m.

Referring to FIG. 7, a dielectric substrate in accordance with one embodiment of this invention will be described below. FIG. 7 illustrates a partial plan view of the dielectric substrate made of an alumina based ceramic substrate of 100 $\mu$m thick made by Kyosera Corporation of Japan. The dielectric substrate allows an Au layer of an arbitrary shape to be arranged on the top surface thereof and a metal layer to be arranged on the entire rear surface thereof to produce microstrip lines thereon. Further, if the Au layer and the metal layer are connected to each other, the Au layer is allowed to be employed as a ground line.

Referring to FIG. 7, the dielectric substrate 12 is provided with an input microstrip line 74 having 50Ω of impedance, an output microstrip line 76 having 50Ω of impedance and a ground line 78 connected to wirings arranged on the other surface of the dielectric substrate 12 through conductors 72 penetrating the dielectric substrate 12 (shown by circles having a hatching therein). These lines 74, 76 and 78 are made of a patterned Au layer. These lines 74, 76 and 78 are arranged at the location corresponding to the rear gate electrode 52, the rear drain electrode 54 and the rear source electrode 56 referred to in the above referring to FIGS. 2(A) and 2(B).

A structure including a semiconductor device in accordance with one embodiment of this invention is produced by placing a semiconductor device 30 (See FIG. 2(A)) on the dielectric substrate 12 in the manner that the rear gate electrode 52 (See FIG. 2(B)) contacts the input microstrip line 74 (See FIG. 7), the rear drain electrode 54 (See FIG. 2(B)) contacts the output microstrip line 76 (See FIG. 7) and the rear source electrode 56 (See FIG. 2(B)) contacts the ground line 78 (See FIG. 7), and by heating them at an approximate temperature of 300° C., while they are pressed to each other. This process causes Sn of the rear electrode 20 (See FIG. 1) and Au of the Au layer (See FIG. 7) to make an alloy. As a result, the rear gate electrode 52, the rear drain electrode 54 and the rear source electrode 56 adhere respectively to the input microstrip line 74, the output microstrip line 76 and the ground line 78.

In the structure including a semiconductor device in accordance with one embodiment of this invention, the contact area with which the rear gate electrode 52, the rear drain electrode 54 and the rear source electrode 56 are fitted respectively to the input microstrip line 74, the output microstrip line 76 and the ground line 78 is notably large in comparison with the flip chips available in the prior art. This is effective to readily disperse heat generated in the semiconductor device, resultantly allowing the semiconductor device to work under stable conditions.

As was described above, the contact area with which the rear gate electrode 52, the rear drain electrode 54 and the rear source electrode 56 are fitted respectively to the input microstrip line 74, the output microstrip line 76 and the ground line 78 is notably large, resultantly causing a large magnitude of the adhesion between the rear gate electrode 52, the rear drain electrode 54 and the rear source electrode 56 and the input microstrip line 74, the output microstrip line 76 and the ground line 78. This is effective to release the requirement to employ a light setting resin adhesive for fitting a semiconductor device to a dielectric substrate. As a result, a drawback in which the stray capacity is large in the neighborhood of an air bridge is removed.

Since the surface wirings and the rear wirings are connected to each other by employing via hole wirings or conductors penetrating the via holes, the length of the connection is equivalent to the thickness of the semiconductor substrate. As a result, the stray impedance of the field effect transistor is sizably small.

The foregoing description has clarified that a semiconductor device appropriate for a microwave circuit and a structure including a semiconductor device in which the area by which a semiconductor device is adhered to a dielectric substrate is large and the strength of adhesion between a semiconductor device and a dielectric substrate is large, are successfully provided by this invention.

Although this invention has been described with reference to specific embodiments, in which the semiconductor device is limited to a GaAs field effect transistor, and the structure including a semiconductor device is limited to a structure including a semiconductor device in which a GaAs field effect transistor alone is arranged therein, this description is not meant to be construed in a limiting sense. In other words, a semiconductor device in accordance with this invention can be a HEMT, a diode, a bipolar transistor or the like. A structure including a semiconductor device in accordance with this invention can be a structure including a semiconductor device in which a DC bias circuit which is connected with a DC power supply by employing a wire bonding system, a matching circuit or the like is arranged in the neighborhood of a GaAs field effect transistor. An alumina based ceramic substrate as the material of a dielectric substrate, can be replaced by a silicon substrate, a quartz substrate or the like. Further, microstrip lines can be replaced by coplaner circuits. Various modifications of the disclosed embodiments, as well as other embodiments of this inventions, will be apparent to persons skilled in the art upon reference to the description of this inventions. It is therefore contemplated that the appended claims will cover any such modifications or embodiments as fall within the true scope of this invention.

What is claimed:

1. A semiconductor device comprising:

a semiconductor substrate;

at least one active element having a plurality of terminals located exclusively in a top surface of said semiconductor substrate;

a plurality of wires respectively connected with the plurality of terminals of said active element, said wires being arranged exclusively on the top surface of said semiconductor substrate;

a plurality of rear electrodes arranged exclusively on a rear surface of said semiconductor substrate;

a plurality of via hole wirings for connecting said wires and said rear electrodes, each of said via hole wirings being arranged in a via hole penetrating said semiconductor substrate;

a dielectric substrate having a top surface confronting and spaced from the rear surface of said semiconductor substrate, the rear surface of said semiconductor substrate having no active elements disposed therein; and a plurality of wirings arranged on the top surface of said dielectric substrate, said wirings being connected with said rear electrodes arranged on the rear surface of said semiconductor substrate.

2. A semiconductor device in accordance with claim 1, wherein said semiconductor substrate is a GaAs substrate.

3. A semiconductor device in accordance with claim 1 or 2, wherein said active element is a field effect transistor, a HEMT, a diode or a bipolar transistor.

4. A semiconductor device in accordance with claim 3, wherein said dielectric substrate is an alumina substrate backed by a metal layer.

5. A semiconductor device in accordance with claim 1 or 2 wherein said dielectric substrate is an alumina substrate backed by a metal layer.

6. A semiconductor device in accordance with claim 1 wherein at least one of said plurality of wirings produced on the top surface of said dielectric substrate is a microstrip circuit.

* * * * *